(12) United States Patent
Arakawa et al.

(10) Patent No.: US 6,821,798 B2
(45) Date of Patent: Nov. 23, 2004

(54) SEMICONDUCTOR OPTICAL DEVICE AND METHOD FOR FABRICATING SAME

(75) Inventors: Satoshi Arakawa, Chiyoda-ku (JP); Tatsuto Kurobe, Chiyoda-ku (JP); Nariaki Ikeda, Chiyoda-ku (JP); Takeharu Yamaguchi, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/044,990

(22) Filed: Jan. 15, 2002

(65) Prior Publication Data

US 2002/0105992 A1 Aug. 8, 2002

(30) Foreign Application Priority Data

Feb. 2, 2001 (JP) .......................................... 2001-027145

(51) Int. Cl.[7] .............................................. H01L 21/00
(52) U.S. Cl. .............................. 438/22; 438/34; 438/35; 438/40; 438/44; 372/49; 372/26; 372/54; 372/109
(58) Field of Search ............................... 438/34, 35, 36, 438/37, 38, 39, 40, 41, 42, 43, 44; 372/49, 26, 50, 59, 109

(56) References Cited

U.S. PATENT DOCUMENTS

| 4,820,655 A | * | 4/1989 | Noda et al. .................. 437/129 |
| 5,165,105 A | * | 11/1992 | Haase et al. .................... 385/8 |
| 5,459,747 A | * | 10/1995 | Takiguchi et al. ............. 372/50 |
| 5,585,957 A | * | 12/1996 | Nakao et al. ................. 359/248 |
| 5,678,935 A | * | 10/1997 | Sakata ......................... 385/131 |
| 5,680,411 A |   | 10/1997 | Ramdane et al. |
| 5,891,748 A | * | 4/1999 | Sakata .......................... 438/31 |
| 5,946,438 A | * | 8/1999 | Minot et al. .................... 385/88 |
| 5,991,473 A | * | 11/1999 | Nishikata et al. .............. 385/14 |
| 6,015,979 A | * | 1/2000 | Sugiura et al. ................ 257/86 |
| 6,026,106 A | * | 2/2000 | Suzuki et al. ................. 372/50 |
| 6,134,368 A | * | 10/2000 | Sakata ......................... 385/131 |
| 6,198,853 B1 | * | 3/2001 | Yamada ......................... 385/2 |
| 6,320,688 B1 | * | 11/2001 | Westbrook et al. ......... 359/181 |
| 6,495,384 B1 | * | 12/2002 | Morimoto et al. ............ 438/32 |

FOREIGN PATENT DOCUMENTS

GB   2 237 654   5/1991

OTHER PUBLICATIONS

R. W. Martin, et al., Semiconductor Science and Technology, vol. 8, No. 6, pp. 1173–1178 , XP–00400530, "The Design of Quantum–Confined Stark Effect Modulators for Integratin with 1.55 μm Lasers", Jun. 1, 1993.
B. Borchert, et al., Japanese Journal of Applied Physics, vol. 33, No. 2, pp. 1034–1039, XP–000595066, "Advanced 1.55 μm Quantum–Well GaInAlAs Laser Diodes with Enhanced Performance", Feb. 1, 1994.
Y. Kawamura, et al., Electronics Letters, vol. 22, No. 5, pp. 242–243, XP–000709976, "Monolithic Integration of InGaAsP/InP DFB Lasers and InGaAs/InAlAs MQW Optical Modulators", Feb. 27, 1986.

* cited by examiner

*Primary Examiner*—Matthew Smith
*Assistant Examiner*—Renzo N. Rocchegiani
(74) *Attorney, Agent, or Firm*—Oblon, Spivak, McClelland, Maier & Neustadt, P.C.

(57) ABSTRACT

A monolithic semiconductor optical device with excellent temperature and modulation characteristics and associated method of manufacturing whereby the device has a semiconductor substrate, a semi-insulating buried heterostructure GaInAsP-based DFB laser; and either a buried ridge type AlGaInAs-based EA or a self aligned structure (SAS) AlGaInAs-based EA modulator.

18 Claims, 10 Drawing Sheets

SEMICONDUCTOR OPTICAL DEVICE AND METHOD FOR FABRICATING SAME

BACKGROUND OF THE INVENTION

1. Field of the Invention

The present invention relates to a semiconductor optical device in which an EA modulator and a DFB laser used as a light source of the EA modulator are monolithically integrated and a method of fabricating the same, and, more particularly, relates to the semiconductor optical device that excels in modulation characteristics and includes the EA modulator most suitable for optical communications.

2. Description of the Related Art

A semiconductor optical device is developed and is put to practical use including an integrated optical modulator and semiconductor laser device in which an optical modulator and a single longitudinal mode semiconductor laser device used as a light source of the optical modulator are monolithically integrated.

As one of such integrated semiconductor optical devices, a semiconductor optical device is attracting attention that includes an electroabsorption type optical modulator (hereinafter referred to as an "EA modulator") that employs a change in the absorption coefficient by an electric field to be used as an optical modulator and a distributed feedback semiconductor laser device (hereinafter referred to as a "DFB laser") to be used as a light source of the EA modulator.

The structure of a conventional EA modulator-DFB-laser-integrated semiconductor optical device (hereinafter referred to as an "EA-DFB") will be described.

The conventional EA-DFB is a semiconductor optical device that includes a DFB laser and an EA modulator both of which are GaInAsP-based SI-BH (semi-insulated buried-hetero) types and in which a hetero-junction structure including a multi-quantum well structure in a semi-insulating layer is buried, and the DFB laser and the EA modulator are monolithically integrated on an n-InP substrate coaxially in a waveguide direction.

In a DFB laser area of the n-InP substrate common to the EA modulator, the DFB laser has a stacked structure including an n-InP lower cladding layer having a thickness of 100 nm, an SCH (Separate Confinement Heterostructure)-MQW (multi-quantum well) made of GaInAsP of which a band-gap wavelength $\lambda g$ is 1.55 $\mu m$, a p-InP upper cladding layer having a thickness of 100 nm, a diffraction grating formed in a diffraction grating layer having a thickness of 10 nm and made of GaInAsP of which a band-gap wavelength $\lambda g$ is 1200 nm, a p-InP upper cladding layer having a thickness of 250 nm that includes a p-InP capping layer having a thickness of 10 nm, and a p-InP upper cladding layer having a thickness of 2000 nm, a p-GaInAs contact layer having a thickness of 300 nm that are common to the EA modulator.

The top surface of the lower cladding layer, the SCH-MQW, the upper cladding layer, the diffraction grating, the upper cladding layer including the p-InP capping layer, the upper cladding layer, and the contact layer of the stacked structure form a mesa structure.

The mesa structure is sandwiched by Fe-doped semi-insulating InP layers (hereinafter referred to as "Fe-InP layer") common to the EA modulator.

A common passivation film made of a SiN film is formed on the Fe-InP layers on both sides of the mesa structure excluding a window on the contact layer. A p-electrode is formed on the contact layer disposing the window therebetween, and a common n-electrode is formed on the bottom surface of the common n-InP substrate.

On an EA modulator area on the n-InP substrate common to the DFB laser, the EA modulator has a stacked structure including an n-InP buffer layer having a thickness of 50 nm, an SCH-MQW made of GaInAsP of which a band-gap wavelength $\lambda g$ is 1.52 $\mu m$, a p-InP upper cladding layer having a thickness of 200 nm, and a p-InP upper cladding layer having a thickness of 2000 nm and a p-GaInAs contact layer having a thickness of 300 nm that are common to the DFB laser.

The top surface of the n-InP buffer layer, the SCH-MQW, the upper cladding layer, the upper cladding layer, and the contact layer 42 of the stacked structure is formed as a mesa structure. The semi-insulating Fe-InP layer common to the DFB laser is buried in both sides of the mesa structure.

The common passivation film made of a SiN film is formed on the Fe-InP layer on both sides of the mesa structure excluding a window on the contact layer.

A p-electrode is formed inside of the window on the contact layer, and a common n-electrode is formed on the bottom surface of the common n-InP substrate.

Then, a method for fabricating the above conventional EA-DFB will be described.

First, the GaInAsP-based DFB-LD structure is formed on the whole area of the n-InP substrate including the DFB laser area and the EA modulator area.

In other words, on the whole area of the n-InP substrate, the n-InP lower cladding layer, the SCH-MQW, the p-InP upper cladding layer, the diffraction grating layer, and the p-InP cap layer are epitaxially grown according to, for example, the MOCVD method.

Thereafter, the cap layer and the diffraction grating layer are etched to form the diffraction grating, and then the p-InP upper cladding layer is epitaxially grown to bury the diffraction grating, and the stacked structure including the cladding layer is formed on the diffraction grating.

Then, an SiN mask for covering the stacked structure of the DFB laser area is formed, and the stacked structure formed in the EA modulator area that is not covered with the mask is etched to expose the n-InP substrate.

Thereafter, the GaInAsP-based EA modulator structure is selectively grown on the n-InP substrate in the exposed area of the optical modulator area. In other words, the n-InP buffer layer, the SCH-MQW, and the p-InP upper cladding layer are epitaxially grown on the n-InP substrate according to, for example, the MOCVD method, thereby forming the stacked structure.

After the SiN mask in the DFB laser area is removed, the p-InP upper cladding layer and the pGaInAs contact layer are epitaxially grown on the whole surface of the substrate.

Thereafter, striped SiN masks having a width of 2 $\mu m$ are consecutively formed on the stacked structure of the DFB laser area and on the stacked structure of the EA modulator area, and then dry etching is performed by using the masks.

Thereby, the mesa structure including the top section of the lower cladding layer, the SCH-MQW, the upper cladding layer, the diffraction grating, the upper cladding layer having the p-InP cap layer, the upper cladding layer, and the contact layer is formed in the DFB laser area.

On the other hand, the mesa structure including the top section of the n-InP buffer layer, the SCH-MQW, the p-InP upper cladding layer, the upper cladding layer, and the contact layer is formed in the EA modulator area.

Thereafter, using the SiN masks as selective-growth masks, a semi-insulating Fe-InP current blocking layer is subjected to buried growth to fill the spaces in both sides of the mesa structure therewith.

The EA-DFB can be fabricated by forming the passivation film, the p-electrodes and the n-electrode.

The above conventional EA-DFB exhibits excellent modulation characteristics. However, in order to satisfy the demand of high-capacity/high-speed communications in the optical communication field, the EA-DFB has been demanded that excels in temperature characteristics and shows excellent high-speed modulation characteristics.

SUMMARY OF THE INVENTION

In one aspect of the present invention (hereinafter referred to as "first invention"), a monolithic semiconductor optical device is provided including: a semiconductor substrate and an electric absorption modulator (EA modulator) including a quantum well structure having AlGaInAs-based material and a width larger than a width of an optical mode field as viewed perpendicular to an optical axis of said EA modulator, and a distributed feedback laser device (DFB laser) including a quantum well structure formed in an EA modulator formation area and in a DFB laser formation area, respectively, on the semiconductor substrate; wherein either of the EA modulator and the DFB laser is firstly formed in the EA modulator formation area or in the DFB laser formation area by etching the other of the EA modulator and the DFB laser to expose the semiconductor substrate in the DFB laser formation area or in the EA modulator formation area, and then the other of the EA modulator and the DFB laser is formed in the EA modulator formation area or in the DFB laser formation area.

In accordance with the first invention, the semiconductor optical device including the EA modulator excellent in the temperature characteristic and the modulation characteristic can be realized by forming the configuration including the EA modulator having the quantum-well-structure active layer made of the AlGaInAs-based material and the specific compound semiconductor stacked structure on the active layer, and the DFB laser that includes the quantum-well-structure active layer made of the GaInAsP-based material that is formed as a BH structure.

In another aspect of the present invention (hereinafter referred as "second invention"), a method for fabricating a semiconductor optical device is provided including the steps of: forming a first stacked structure including either of a DFB laser having a quantum-well-structure active layer made of a GaInAsP-based material or EA modulator having a quantum-well-structure active layer made of an AlGaInAs-based material in a DFB laser formation area and in an EA modulator formation area, respectively, on a semiconductor substrate; forming a second stacked structure by etching the area corresponding to the other of the DFB laser or the EA modulator to expose the substrate in this area; forming a third stacked structure including the other of the DFB laser or the EA modulator on the exposed substrate; and forming a mesa stripe by simultaneously etching the second and third stacked structures.

In accordance with the second invention, the suitable method for fabricating the semiconductor optical device of the invention can be realized. In other words, by the dry etching for the mesa formation that uses etchant of methane mixed gas or bromine-containing etchant, the DFB-LD area made of a GaInAsP-based material can reach halfway of the substrate, however, only the upper side of the EA modulator area made of an AlGaInAs-based material is etched because the AlGaInAs is not etched. Therefore, the BH structure and the buried ridge structure can be easily integrated.

The above and other objects, features and advantages of the present invention will be more apparent from the following description.

PREFERRED EMBODIMENTS OF THE INVENTION

The present inventor has conceived that an AlGaInAs-based quantum well structure, instead of the conventional GaInAs-based quantum well structure, is used as an active layer of the EA modulator so as to improve the temperature characteristics and the modulation characteristics.

However, because an Al-containing layer such as an AlGaInAs layer is easily oxidized when it is exposed to air during the formation of a mesa structure, the characteristic of AlGaInAs may change.

Therefore, it is difficult to employ a BH (Buried Hetero) structure in which the mesa structure is sandwiched by a pair of current block layers in the EA modulator having the AlGaInAs-based quantum well structure.

Accordingly, the present inventor has experimentally confirmed that, in fabricating a semiconductor optical device in which a DFB laser and an EA modulator are monolithically integrated, an Al containing layer such as an AlGaInAs layer can be prevented from being oxidized by forming the DFB laser including a GaInAsP-based BH structure and by allowing the AlGaInAs-based EA modulator to have a structure in which a quantum well is not etched such as a ridge structure, a buried ridge structure and an SAS structure.

Further, the present inventor has conceived that the stripe formation of the DFB laser area and the EA modulator area, the mesa etching, and the buried growth are carried out simultaneously, and further conceived that, when the partial stacked structure up to the lower cladding layer in the DFB laser area is etched, the Al-containing layer such as an AlGaInAs layer in the EA modulator area are used as an etch stopper by using the dry etching selectivity of the etchant such as a methane series gas and a bromine-containing gas between the Al-containing layer and the Al-non-containing layer in the etching of the mesa structure. Thereby, the automatic and easy formation of the DFB laser having the BH structure and the EA modulator having the buried ridge structure could be experimentally confirmed.

Based on the experimental findings, the first invention has been made.

Preferably, the EA modulator has a striped optical waveguide layer made of GaInAsP or AlGaInAs as at least a part of the upper cladding layer when the EA modulator includes a compound semiconductor stacked structure of a buried ridge structure or an SAS structure and includes a semi-insulating InP layer as a buried layer. As a result, the formation of a lateral-light-confinement structure with respect to the buried InP layer and the improvement of the waveguide efficiency can be obtained.

In the formation of the first and second stacked structures, the optical waveguide layer made of GaInAsP or AlGaInAs may be formed as at least a part of the upper cladding layer.

In the etching step for the mesa formation using the dry etching method, the AlGaInAs-based material layer that constitutes at least a part of the quantum-well-structure active layer or at least a part of the upper cladding layer acts as an etch stopping layer in the EA modulator formation area. Further, in the etching step for the mesa formation, dry etching is carried out in a reactor of a MOCVD while using brome-containing gas such as $CBr_4$ as etchant after the step of forming the stacked structure.

Subsequently to the etching step for the mesa formation, the two stacked structures are simultaneously buried in the semi-insulating InP layer, and, in the EA modulator formation area, a compound semiconductor stacked structure of either of a buried ridge structure or an SAS structure is formed, and, in the DFB laser formation area, a BH structure is formed.

Then, the configuration of a semiconductor optical device in accordance with embodiments of the present invention will be described referring to the annexed drawings.

Embodiment 1 of Semiconductor Optical Device

This embodiment is one example of a semiconductor optical device in which the EA modulator and the DFB laser are monolithically integrated (EA-DFB).

Figure 1:
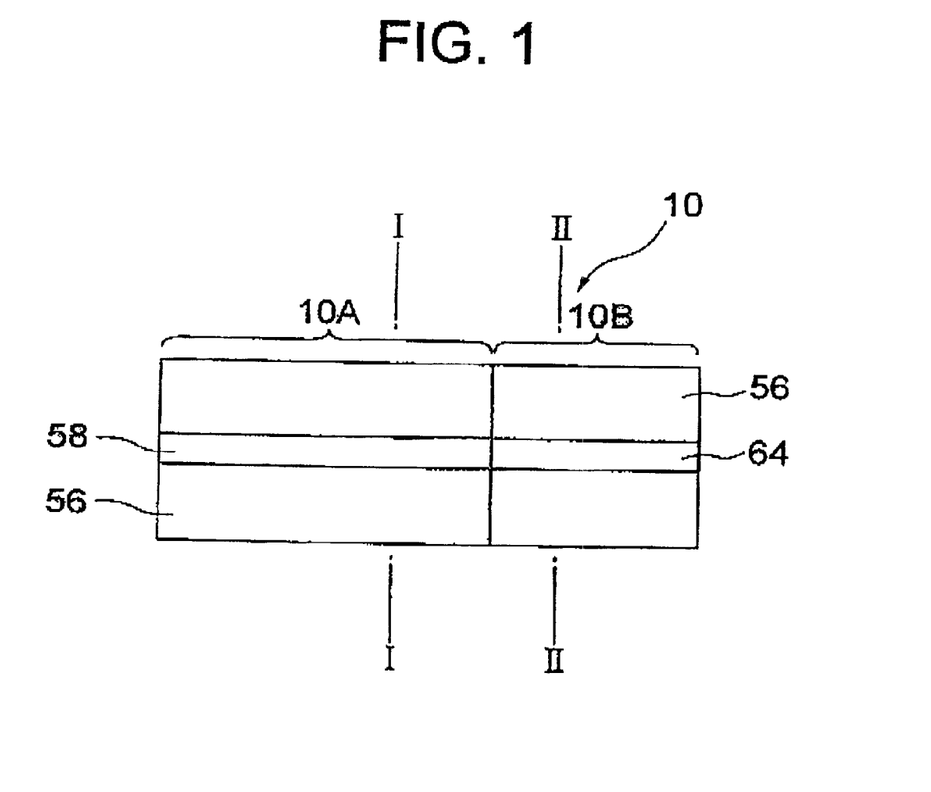
FIG. 1 is a top plan view showing an EA-DFB of Embodiment 1.

As shown in FIG. 1, an EA-DFB 10 of the embodiment is a semiconductor optical device that includes a buried ridge type AlGaInAs-based EA modulator and an SI-BH type GaInAsP-based DFB. The DFB laser 10A and the EA modulator 10B are integrated on a single n-InP substrate 12 monolithically and coaxially in a waveguide direction.

Figure 2A:
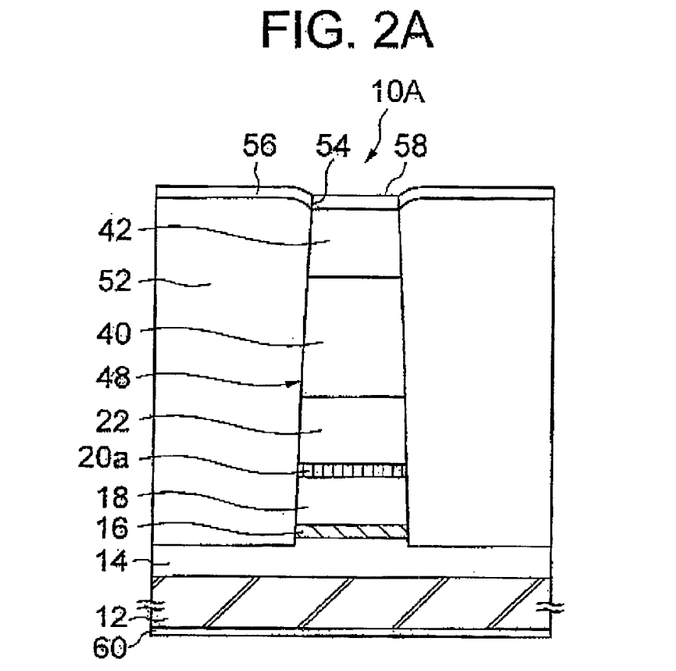
FIGS. 2A and 2B are sectional views along the lines I—I and II—II of FIG. 1, respectively; showing the structure of the DFB laser and the EA modulator.

The DFB laser 10A includes substantially same structure as the conventional DFB laser. As shown in FIG. 2A, the DFB laser 10A has a stacked structure, in a DFB laser area 12A of the n-InP substrate 12 common to the EA modulator 10B, including an n-InP lower cladding layer 14 having a thickness of 100 nm, an SCH-MQW 16 made of GaInAsP of which a band-gap wavelength λg is 1.55 μm, a p-InP upper cladding layer 18 having a thickness of 100 nm, a diffraction grating 20a formed in a diffraction grating layer 20 having a thickness of 10 nm that is made of GaInAsP of which a band-gap wavelength λg is 1200 nm, a p-InP upper cladding layer 24 having a thickness of 250 nm that includes a p-InP cap layer 22 having a thickness of 10 nm, a p-InP upper cladding layer 40 having a thickness of 2000 nm, and a p-GaInAs contact layer 42 having a thickness of 300 nm.

A portion of the lower cladding layer 14, the SCH-MQW 16, the upper cladding layer 18, the diffraction grating 20a, the upper cladding layer 24, the upper cladding layer 40, and the contact layer 42 of the stacked structure form a mesa structure 48. Further, the mesa structure 48 is sandwiched by a pair of Fe-doped semi-insulating InP layers (Fe-InP layer) 52.

A common passivation film 56 made of a SiN film is formed on the Fe-InP layers 52 sandwiching the mesa structure 48 excluding a window 54 on the contact layer 42.

A p-electrode 58 is formed inside of the window 42 on the contact layer 42, and a common n-electrode 60 is formed on the bottom surface of the common n-InP substrate 12.

Figure 2B:
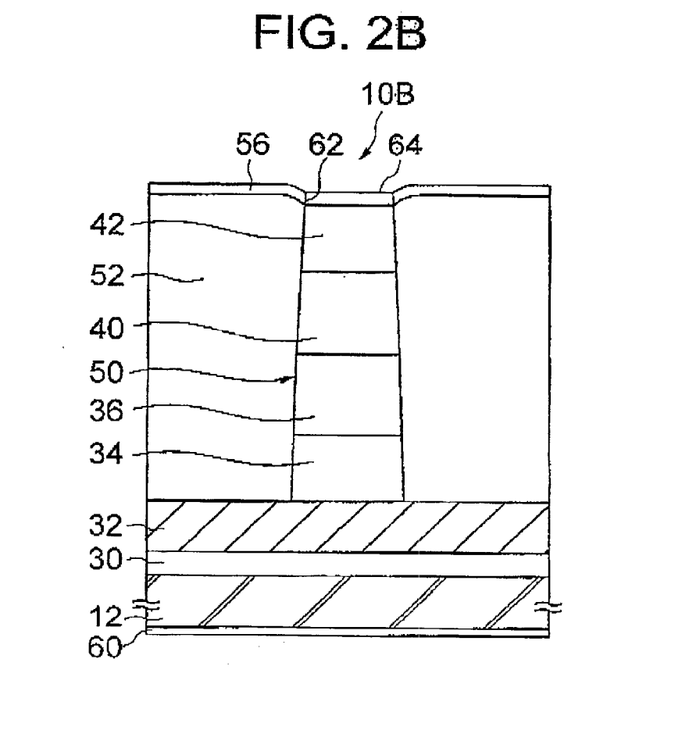

As shown in FIG. 2B, the EA modulator 10B has a stacked structure, in the EA modulator area 12B of the n-InP substrate 12 common to the DFB laser 10A, including an n-InP buffer layer 30 having a thickness of 50 nm, an SCH-MQW 32 made of AlGaInAs of which a band-gap wavelength λg is 1.52 μm, an optical waveguide layer 34 having a thickness of 200 nm that is made of pGaInAsP of which a band-gap wavelength λg is 1100 nm, a p-InP upper cladding layer 36 having a thickness of 200 nm, a p-InP upper cladding layer 40 having a thickness of 2000 nm, and a p-GaInAs contact layer 42 having a thickness of 300 nm.

The optical waveguide layer 34, the upper cladding layer 36, the upper cladding layer 40, and the contact layer 42 of the stacked structure form a mesa structure 50. Further, the mesa structure 50 are sandwiched by a pair of the semi-insulating Fe-InP layers 52.

The common passivation film 56 made of an SiN film is formed on the Fe-InP layers 52 sandwiching the mesa structure 50 excluding a window 62 on the contact layer 42.

A p-electrode 64 is formed inside of the window 62 on the contact layer 42, and the common n-electrode 60 is formed on the bottom surface of the common n-InP substrate 12.

Fabrication of Semiconductor Optical Device of Embodiment 1

A method for fabricating the semiconductor optical device of the Embodiment 1 will be described referring to FIGS. 3A to 3D, 4 and 5.

Figure 3A:
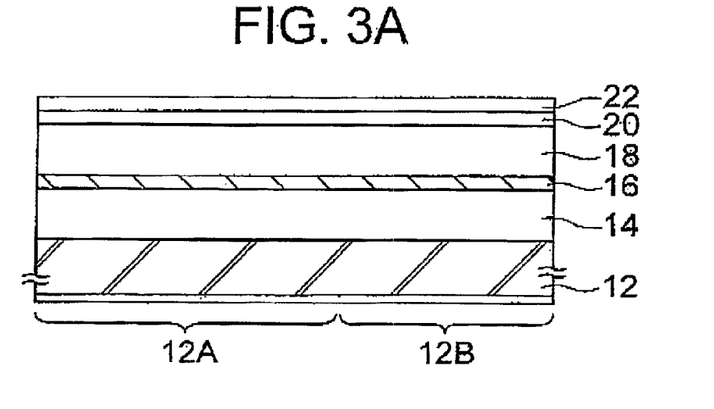
FIGS. 3A to 3D are vertical sectional views sequentially showing a method for fabricating the EADFB of FIG. 1.

First, as shown in FIG. 3A, a GaInAsP-based DFB-LD structure up to the wave guide layer is formed on the whole surface of the n-InP substrate 12 that includes the DFB laser area 12A and the EA modulator area 12B.

In detail, the n-InP lower cladding layer 14 having a thickness of 100 nm, the SCH-MQW 16 made of GaInAsP of which a band-gap wavelength λg is 1.55 μm, the p-InP upper cladding layer 18 having a thickness of 100 nm, the diffraction grating layer 20 having a thickness of 10 nm that is made of GaInAsP of which band-gap wavelength λg is 1200 nm, and the p-InP cap layer 22 having a thickness of 10 nm are epitaxially grown on the n-InP substrate 12 according to, for example, the MOCVD.

Figure 3B:
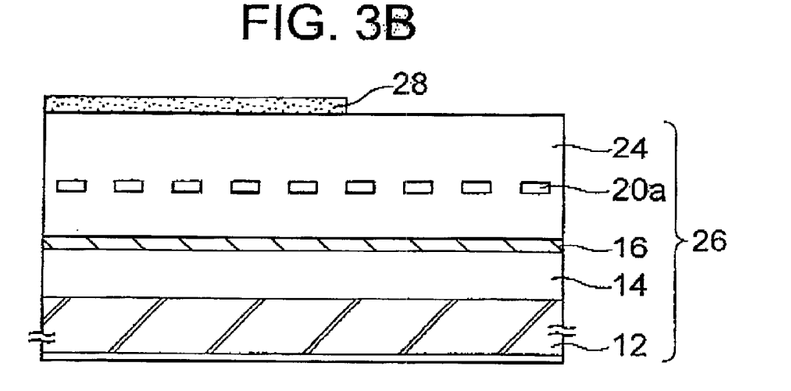

Then, as shown in FIG. 3B, the cap layer 22 and the diffraction grating layer 20 are etched to form the diffraction grating 20a, and the p-InP upper cladding layer 24 having a thickness of 250 nm is epitaxially grown to bury the diffraction grating 20a, and a stacked structure 26 having the cladding layer 24 on the diffraction grating 20a is formed.

Then, an SiN mask 28 with which the stacked structure 26 in the DFB laser area 12A is covered is formed.

Figure 3C:
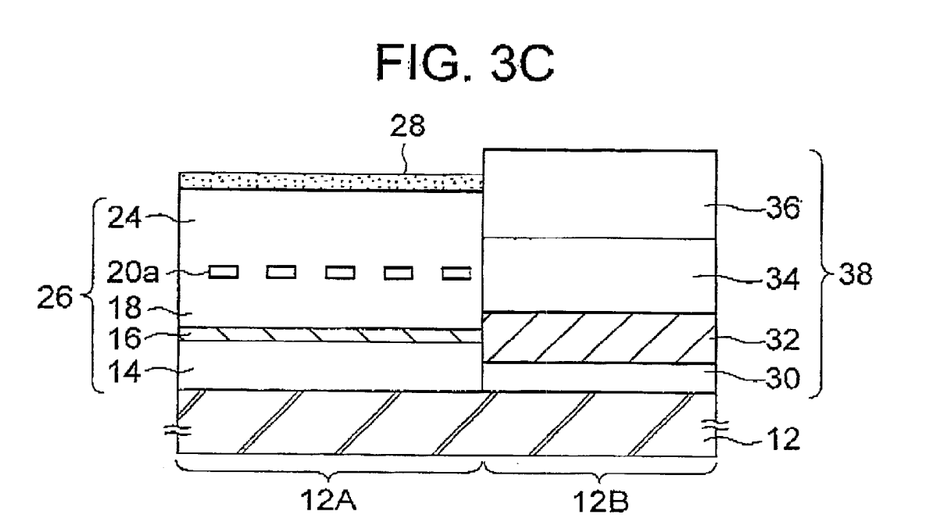

Then, after the stacked structure 26 formed in the EA modulator area 12B is etched to expose the n-InP substrate 12, the AlGaInAs-based EA modulator structure 38 is selectively grown on the n-InP substrate 12 in the EA modulator area 12B as shown in FIG. 3C.

In more detail, the n-InP buffer layer 30 having a thickness of 50 nm, the SCH-MQW 32 made of AlGaInAs of which a band-gap wavelength λg is 1.52 μm, the optical waveguide layer 34 having a thickness of 200 nm that is made of p-GaInAsP of which a band-gap wavelength μg is 1100 nm, and the p-InP upper cladding layer 36 having a thickness of 200 nm are epitaxially grown on the n-InP substrate 12 according to, for example, the MOCVD method, thereby forming the stacked structure 38.

Figure 3D:
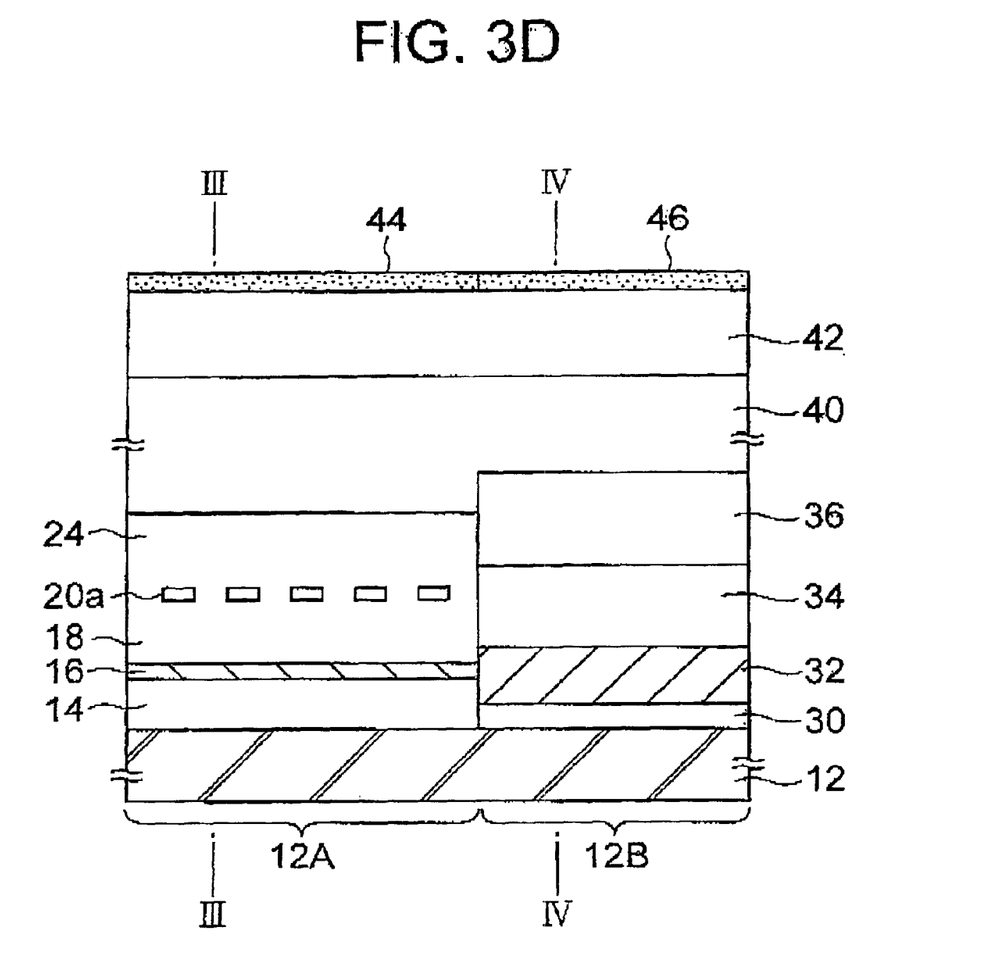

Thereafter, as shown in FIG. 3D, after the removal of the SiN mask 28 in the DFB laser area, the p-InP upper cladding layer 40 having a thickness of 2000 nm and the p-GaInAs contact layer 42 having a thickness of 300 nm are epitaxially grown on the whole surface of the substrate.

Thereafter, consecutive SiN masks 44 and 46 each having a width of 2 μm are formed on the stacked structures in the DFB laser area 12A and the EA modulator area 12B, respectively.

Then, by using the SiN masks 44 and 46, dry etching is carried out according to the RIE method that uses etchant of the $CH_4$ series to make an etching depth of 3000 nm.

Figure 4:
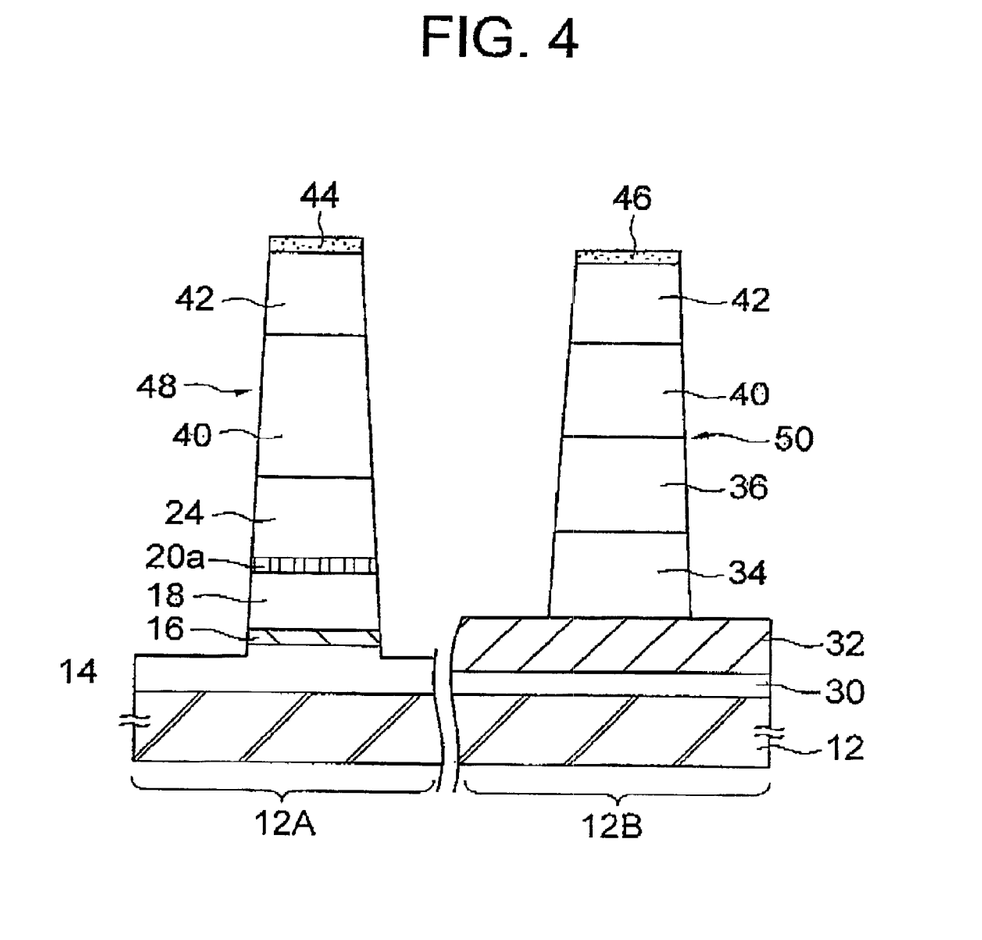
FIG. 4 is a vertical sectional view taken along the line III—III of FIG. 31).

Thereby, as shown in the left side section of FIG. 4, the lower cladding layer 14 is etched halfway, and the mesa structure 48 including the upper part of the lower cladding layer 14, the SCH-MQW 16, the upper cladding layer 18, the diffraction grating 20a, the upper cladding layer 24 including the p-InP cap layer 22, the upper cladding layer 40, and the contact layer 42 is formed in the DFB laser area 12A.

On the other hand, as shown in the right hand section of FIG. 4, since the AlGaInAs layer that constitutes the SCH-MQW 32 functions as an etch stop layer in the EA modulator area 12B, the etching stops at the top surface of the SCH-MQW 32, and the mesa structure 50 including the optical waveguide layer 34, the upper cladding layer 36, the upper cladding layer 40, and the contact layer 42 is formed.

Figure 5:
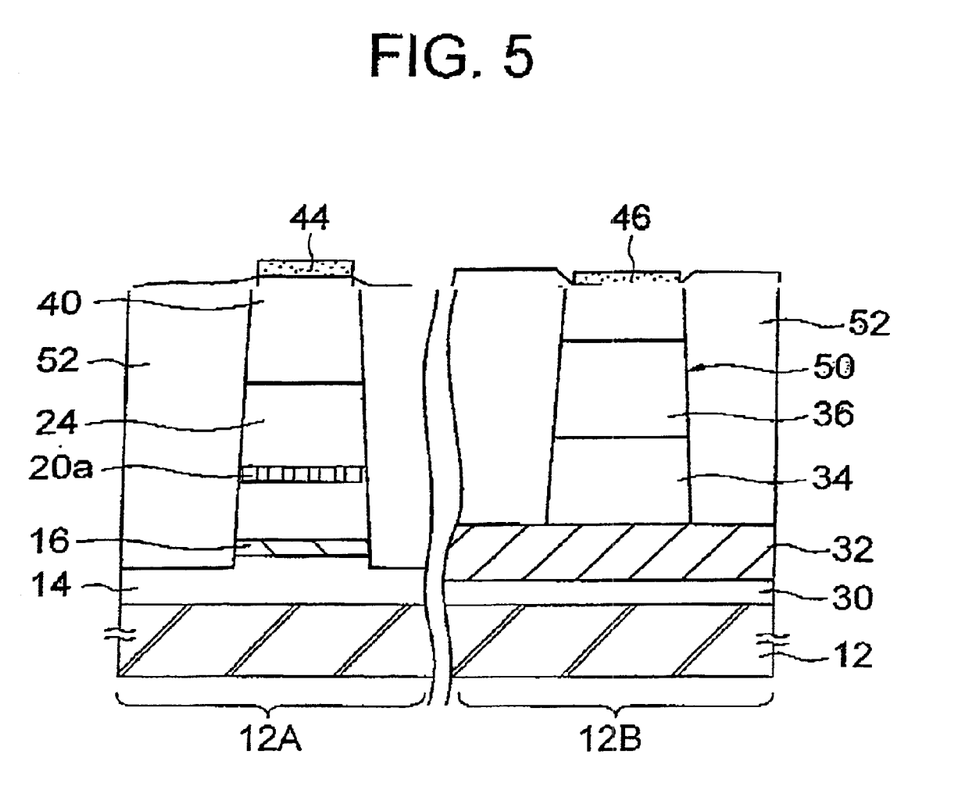
FIG. 5 is a vertical sectional view taken along the line IV—IV of FIG. 3D.

Thereafter, as shown in FIG. 5, the semi-insulating Fe-InP current blocking layers 52 having a thickness of 2500 nm are grown on the both sides of the mesa structures 48 and 50 by using the SiN masks 44 and 46 as selective-growth masks in the DFB laser area 10A and in the EA modulator area 10B, respectively.

A passivation film, a separation groove, an electrode not shown in the drawings may be formed, if necessary, to form the EA-DFB 10 of Embodiment 1 that includes the DFB laser 10A and the EA modulator 10B.

After a sample EA-DFB that has substantially same structure as the EA-DFB 10 of Embodiment 1 was fabricated according to the above method for Embodiment 1 and the modulation characteristics of the sample EA-DFB was evaluated, the improvement of the modulation characteristics was confirmed in comparison with the conventional EA-DFB in which the EA modulator was made of GaInAsP.

That is, the frequency characteristics of the EA modulator 10B of the sample semiconductor optical device were 18 GHz which were significantly larger than 10 GHz of the conventional EA modulator.

Embodiment 2 of Semiconductor Optical Device

This embodiment is another example of the semiconductor optical device according to the present invention applied to the EA-DFB including the EA modulator and the DFB laser monolithically integrated.

Figure 6:
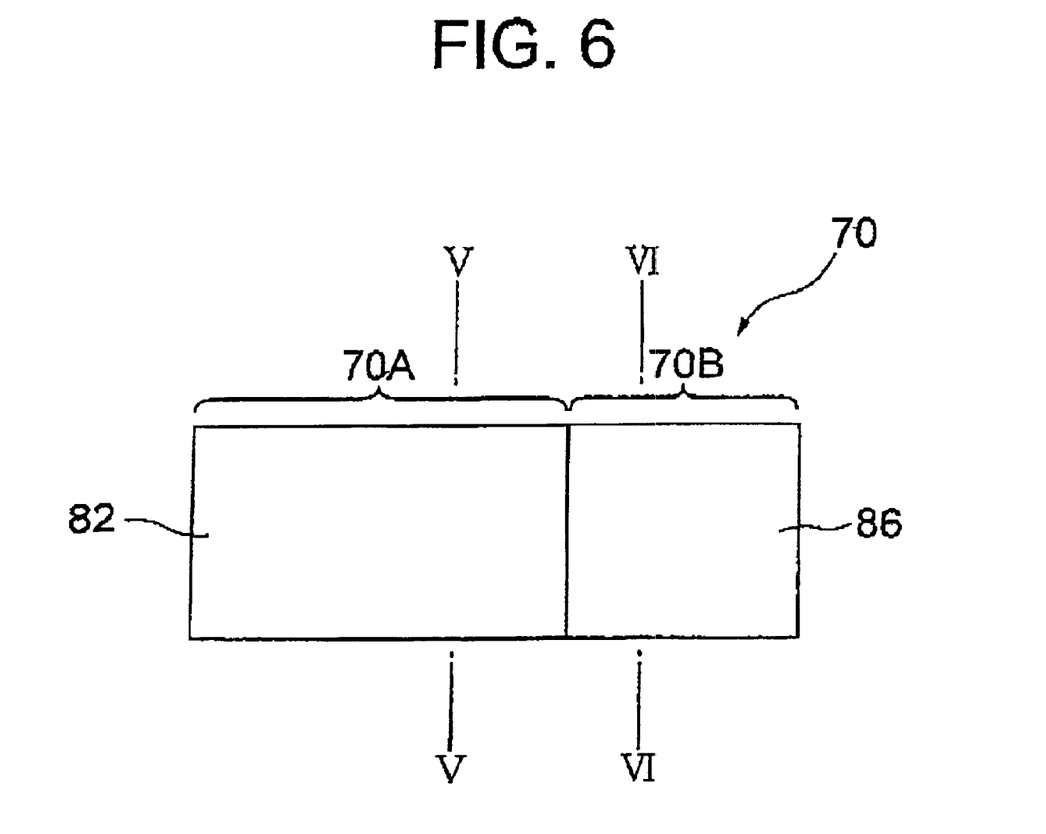
FIG. 6 is a top plan view showing an EA-DFB of Embodiment 2.

As shown in FIG. 6, an EA-DFB 70 of this embodiment includes a DFB laser 70A having a SI-PBH (Semi Insulating Planar Buried Hetero) structure that employs an Fe-doped high-resistance InP layer acting as a current block layer, and an EA modulator 70B having a structure in which a quantum-well-structure active layer is left on the whole surface of the substrate (i.e., SAS structure). As shown therein, the DFB laser 70A and the EA modulator 70B are integrated on the single n-InP substrate monolithically and coaxially in the waveguide direction.

Figure 7A:
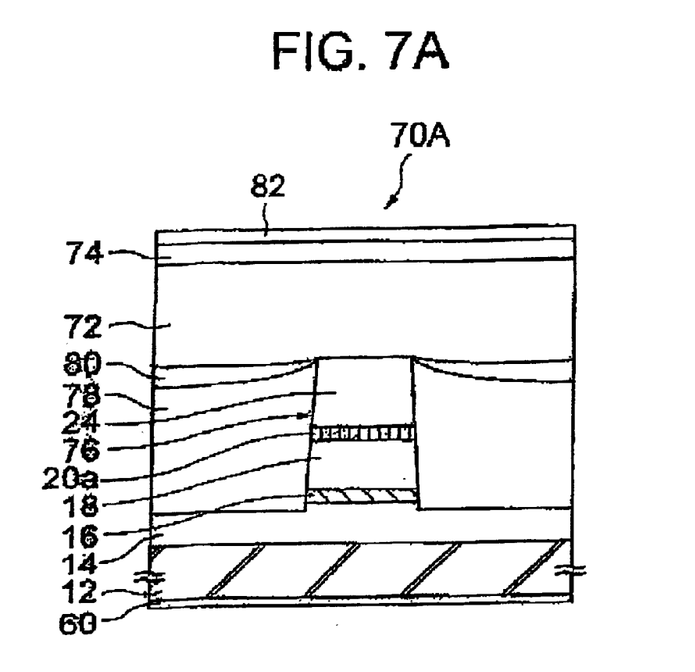
FIGS. 7A and 7B are sectional views along the lines V—V and VI—VI of FIG. 6, respectively, showing the structure of the DFB laser and the EA modulator.

As shown in FIG. 7A, the DFB laser 70A has a stacked structure, in the DFB laser area on the n-InP substrate 12 common to the EA modulator 70B, including the n-InP lower cladding layer 14 having a thickness of 100 nm, the SCH-MQW 16 made of GaInAsP of which a band-gap wavelength λg is 1.55 μm, the p-InP upper cladding layer 18 having a thickness of 100 nm, the diffraction grating 20a formed in the diffraction grating layer 20 having a thickness of 10 nm that is made of GaInAsP of which a band-gap wavelength leg is 1200 nm, the p-InP upper cladding layer 24 having a thickness of 250 nm that includes the p-InP cap layer 22 (not shown) having a thickness of 10 nm, and a p-InP upper cladding layer 72 having a thickness of 2000 nm and a p-GaInAs contact layer 74 having a thickness of 300 nm that are common to the EA modulator 70B.

A portion of the lower cladding layer 14, the SCH-MQW 16, the upper cladding layer 18, the diffraction grating 20a, and the upper cladding layer 24 including the p-InP cap layer 22 of the stacked structure form a mesa structure 76.

Further, the mesa structure 76 is sandwiched by a pair of semi-insulating Fe-InP layers 78 common to the EA modulator 70B. Further, on the Fe-InP layer 78, an n-InP layer 80 having a thickness of 100 nm common to the EA modulator 70B is formed as a hole blocking layer such that the Fe-InP layer 78, which captures electrons but does not capture positive holes, is not in contact directly with the p-InP upper cladding layer 72.

The p-InP upper cladding layer 72 and the pGaInAs contact layer 74 are placed on the p-InP upper cladding layer 24 and the n-InP layer 80.

Further, a p-electrode 82 is formed on the contact layer 74, and the common n-electrode 60 is formed on the bottom surface of the common n-InP substrate 12.

Figure 7B:
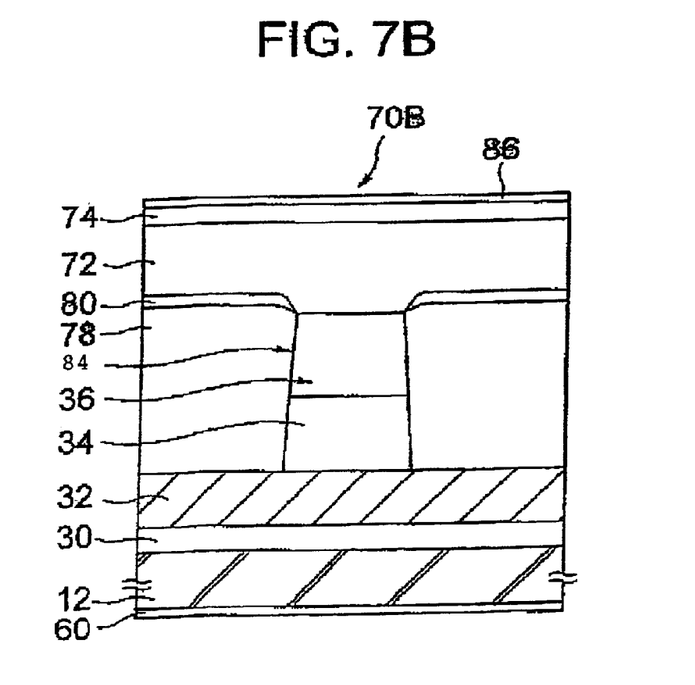

As shown in FIG. 7B, the EA modulator 70B has a stacked structure, in the EA modulator area of the n-InP substrate 12 common to the DFB laser 70A, including the n-InP buffer layer 30 having a thickness of 50 nm, the SCH-MQW 32 made of AlGaInAs of which a band-gap wavelength λg is 1.52 μm, the optical waveguide layer 34 having a thickness of 200 nm that is made of p-GaInAsP of which a band-gap wavelength Ag is 1100 nm, the p-InP upper cladding layer 36 having a thickness of 200 nm, and the p-InP upper cladding layer 72 having a thickness of 2000 nm and the p-GaInAs contact layer 74 having a thickness of 300 nm that are common to the DFB laser 70A.

The optical waveguide layer 34 and the upper cladding layer 36 of the stacked structure form as a mesa structure 84. Further, the mesa structure 84 is sandwiched by the pair of the semi-insulating Fe-InP layers 78, and the nInP layer 80 is formed on the Fe-InP layers 78.

The p-InP upper cladding layer 72 and the pGaInAs contact layer 74 are placed on the p-InP upper cladding layer 36 and the n-InP layers 80.

A p-electrode 86 is formed on the contact layer 74, and the common n-electrode 60 is formed on the bottom surface of the common n-InP substrate 12.

Fabrication of Semiconductor Optical Device of Embodiment 2

A method for fabricating the semiconductor optical device of the Embodiment 2 will be described referring to FIGS. 8 to 10.

In this embodiment, the stacked structure 26 is formed in the DFB laser area on the n-InP substrate 12, and the stacked structure 38 is formed in the EA modulator area on the n-InP substrate 12 similarly to the fabrication in Embodiment 1 as shown in FIG. 3C.

Thereafter, consecutive striped SiN masks 88 and 90 having a width of 2 pm are formed on the stacked structures 26 and 38 in the DFB laser area and the EA modulator area, respectively. Then, by using the SiN masks 88 and 90, dry etching is carried out according to the RIE method that uses etchant of the CH, series to make an etching depth of 500 nm.

Figure 8:
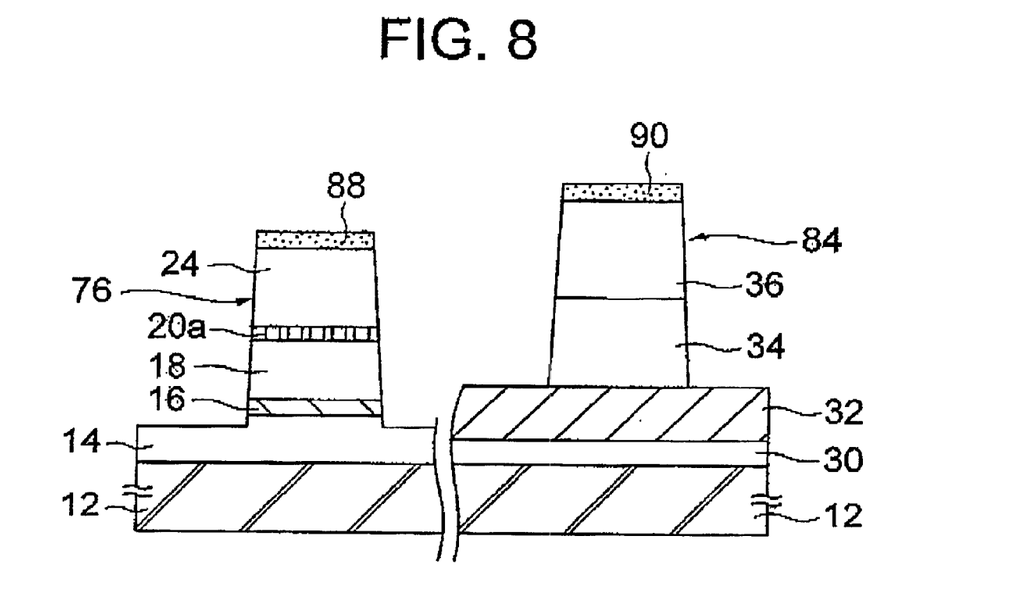
FIGS. 8, 9 and 10 are vertical sectional views sequentially showing a method for fabricating the EA-DFB of FIG. 6.

Thereby, as shown in the left side section of FIG. 8, the lower cladding layer 14 is etched halfway, and the mesa structure 76 including the upper part of the lower cladding layer 14, the SCH-MQW 16, the upper cladding layer 18, the diffraction grating 20a, and the upper cladding layer 24 including the p-InP cap layer 22 is formed in the DFB laser area 12A.

On the other hand, as shown in the right hand section of FIG. 8, since the AlGaInAs layer that constitutes the SCH-MQW 32 functions as an etch stop layer in the EA modulator area 12B, the etching stops at the top surface of the SCH-MQW 32, and the mesa structure 84 including the optical waveguide layer 34 and the upper cladding layer 36 is formed.

Figure 9:
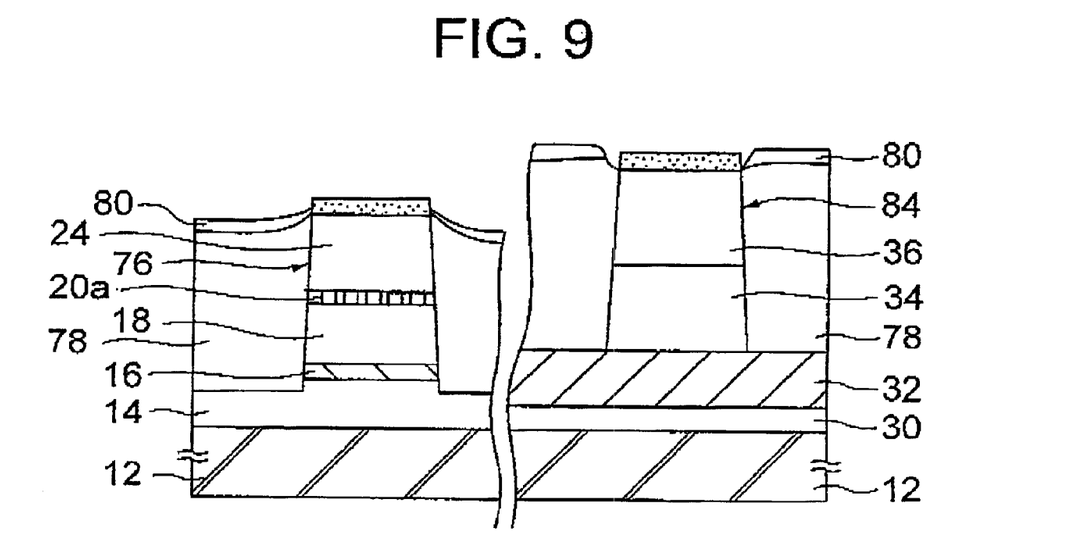

Thereafter, as shown in FIG. 9, the semi-insulating Fe-InP current blocking layers 78 having a thickness of 400 nm are grown on the both sides of the mesa structures 76 and 84 by using the SiN masks 88 and 90 as selective-growth masks in the DFB laser area 12A and in the EA modulator area 12B, respectively. The n-InP hole blocking layers 80 having a thickness of 100 nm are formed on the Fe-InP current blocking layers 78.

Figure 10:
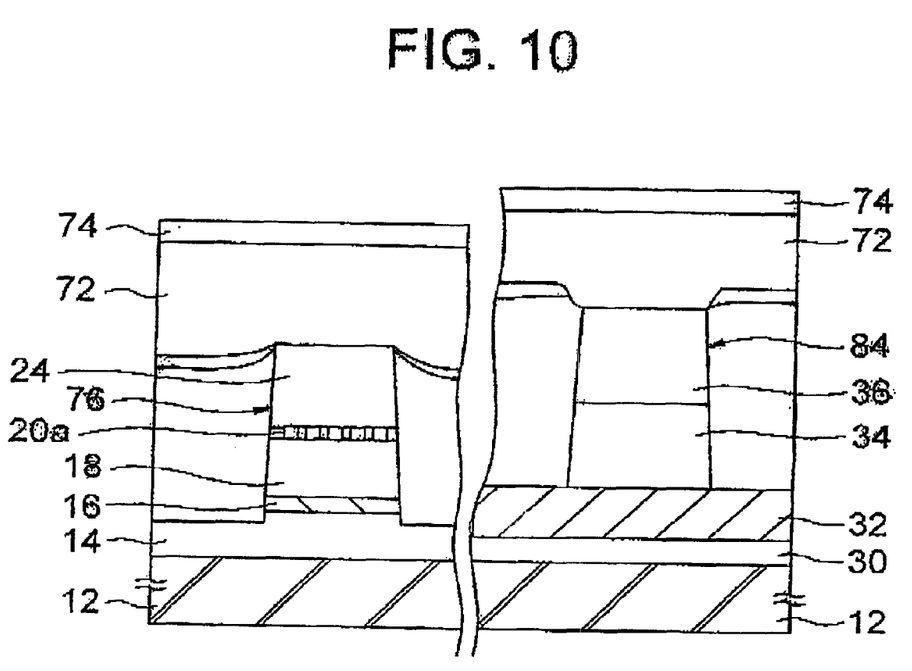

Thereafter, as shown in FIG. 10, after the removal of the SiN masks 88 and 90, the p-InP upper cladding layer 72 having a thickness of 2000 nm and the p-GaInAs contact layer 74 having a thickness of 300 nm are epitaxially grown on the whole surface of the substrate in the DFB laser area 12A and in the EA modulator area 12B.

A passivation film, a separation groove, an electrode may be formed, if necessary, to form the EA-DFB 70 shown in FIGS. 6, 7A and 7B.

After a sample semiconductor optical device that had substantially same structure as the EA-DFB 70 of Embodiment 2 was fabricated according to the above method for Embodiment 2 and the modulation characteristics of the sample semiconductor optical device was evaluated, the improvement of the modulation characteristics was confirmed similarly to the EA-DFB 10 of Embodiment 1.

Since the above embodiment is described only for examples, the present invention is not limited to the above embodiment and various modifications or alterations can be easily made therefrom by those skilled in the art without departing from the scope of the present invention.

What is claimed is:

1. A monolithic semiconductor optical device comprising:
a common semiconductor substrate configured to have an electric absorption modulator formation area and a DFB laser formation area;
an electric absorption modulator (EA modulator) formed in the electric absorption modulator formation area and having an aluminum-based EA modulator active region not being included as part of a mesa stripe configuration; and
a distributed feedback laser device (DFB laser) formed in the DFB laser formation area and having a non-aluminum-based DFB laser active region being included as part of a mesa stripe configuration.

2. The monolithic semiconductor optical device according to claim 1, wherein:
the EA modulator active region is configured to be quantum wells and comprises an AlGaInAs-based material.

3. The monolithic semiconductor optical device according to claim 2, wherein:
the EA modulator active region is configured to be at least a couple of an SCH (Separate Confinement Heterostructure) and comprises an AlGaInAs-based material.

4. The monolithic semiconductor optical device according to claim 2, wherein:
the DFB laser active region is configured to be a quantum well and comprises a GaInAsP-based material.

5. The monolithic semiconductor optical device according to claim 1, wherein:
the EA modulator active region is configured to be wider than the DFB laser active region.

6. The monolithic semiconductor optical device according to claim 4, wherein the EA modulator comprises:
at least one of a buried ridge structure or a self aligned structure (SAS).

7. The monolithic semiconductor optical device according to claim 6, wherein the EA modulator comprises:
an optical waveguide stripe layer comprising at least one of a GaInAsP or AlGaInAs layer in an upper cladding layer.

8. The monolithic semiconductor optical device according to claim 6, wherein the EA modulator comprises:
AlGaInAs layer configured as an SCH-MQW and as an etchant stop.

9. The monolithic semiconductor optical device according to claim 1, wherein:
the DFB laser comprises a semi-insulating buried heterostructure GaInAsP-based DFB laser; and
the EA modulator comprises a buried ridge type AlGaInAs-based EA modulator.

10. The monolithic semiconductor optical device according to claim 1, wherein:
the DFB laser comprises a semi-insulating planar buried heterostructure GaInAsP-based DFB laser; and
the EA modulator comprises a self aligned structure (SAS) AlGaInAs-based EA modulator.

11. A monolithic semiconductor optical device comprising:
a common semiconductor substrate configured to have an electric absorption modulator formation area and a DFB laser formation area;
an AlGaInAs-based quantum well electric absorption modulator (EA modulator) formed in the electric absorption modulator formation area and having an aluminum-based EA modulator active region not being included as part of a mesa stripe configuration;
a quantum well structure distributed feedback laser device (DFB laser) formed in the DFB laser formation area and having a non-aluminum based DFB laser active region being included as part of a mesa stripe configuration;
means for generating a coherent light; and
means for modulating the coherent light at a modulation rate greater than 10 GHz.

12. A method for fabricating a monolithic semiconductor optical device comprising steps of:

provided a common substrate having a modulator formation area and a laser formation area; and forming on the common substrate a multilayer structure that is at least a portion of a DFB laser including a non-aluminum based active region being included as a part of a mesa stripe configuration; and forming on the common substrate a multilayer structure that is at least a portion of an EA modulator including an aluminum based active region not being included as a part of a mesa stripe configuration.

13. The method as defined in claim 12, further comprising:

forming the multilayer structure that is at least a portion of a DFB laser across the common substrate to form a first stacked structure;

etching the first stacked structure, wherein said etching step is configured to create a second stacked structure and to expose a portion of the substrate, wherein the portion of the substrate corresponds to the modulator formation area;

forming on the exposed portion of the substrate the multilayer structure that is at least a portion of an EA modulator, wherein said forming on the exposed portion of the substrate is configured to form a third stacked structure including the aluminum-based active region; and forming a mesa stripe by simultaneously etching the second stacked structure and third stacked structure said etching of the third stacked structure not extending into the aluminum-based active region.

14. The method as defined in claim 13, wherein the step of forming a mesa stripe comprises:

a substep of dry etching.

15. The method as defined in claim 14, wherein said substep of dry etching comprises a substep of:

etching with one of a methane-based and a bromine-containing etchant in a chamber of a film-forming apparatus.

16. The method as defined in claim 12, further comprising step of:

burying the mesa stripe with at least one semi-insulating InP layer, wherein said burying step is configured to form a BH structure in the DFB laser formation area and at least one of a buried ridge structure and an SAS structure in the EA modulator formation area.

17. The method as defined in claim 12, further comprising:

forming the multilayer structure of an EA modulator across the common substrate to form a first stacked structure having an aluminum based active region;

etching the first stacked structure, wherein said etching step is configured to create a second stacked structure and to expose a portion of the substrate, wherein the portion of the substrate corresponds to the DFB laser formation area;

forming on the exposed portion of the substrate the multilayer structure of a DFB laser, wherein said forming on the exposed portion of the substrate is configured to form a third stacked structure including a non-aluminum based active region; and forming a mesa stripe by simultaneously etching the second stacked structure and the third stacked structure said etching of the second stacked structure not extending into the aluminum based active region.

18. A method for fabricating a monolithic semiconductor optical device comprising steps of:

providing a common substrate having a modulator formation area and laser formation area;

forming a multilayer structure of a DFB laser on the common substrate in said laser formation area;

forming a multilayer structure of an EA modulator on the common substrate in said modulator formation area; and forming a mesa stripe by simultaneously etching said laser formation area and said modulator formation area in such a way that the multilayer structure of a DFB laser is selectively etched to a deeper depth than that for the multilayer structure of an EA modulator.

* * * * *